United States Patent [19]
Mizuno et al.

[11] Patent Number: 5,912,463
[45] Date of Patent: Jun. 15, 1999

[54] PHOTODETECTOR AND SOLID-STATE IMAGING APPARATUS

[75] Inventors: Seiichiro Mizuno; Hideo Takahashi; Masatoshi Ishihara, all of Hamamatsu, Japan

[73] Assignee: Hamamatsu Photonics K.K., Hamamatsu, Japan

[21] Appl. No.: 08/912,694

[22] Filed: Aug. 18, 1997

[30] Foreign Application Priority Data

Aug. 19, 1996 [JP] Japan ..................................... 8-217601
Aug. 19, 1996 [JP] Japan ..................................... 8-217602
Aug. 19, 1996 [JP] Japan ..................................... 8-217603

[51] Int. Cl.$^6$ .................................................. H01L 31/00
[52] U.S. Cl. ..................................... 250/338.1; 250/214 R
[58] Field of Search ........................... 250/338.1, 339.09, 250/341.5, 252.1 A, 214 C, 216, 214 R; 348/243; 377/59; 327/552

[56] References Cited

U.S. PATENT DOCUMENTS 3,963,942  6/1976  Sequin et al. ............................. 377/59
4,079,238  3/1978  Lampe et al. ............................. 327/552
4,781,195  11/1988  Martin ........................................ 356/41

FOREIGN PATENT DOCUMENTS 55-160478  12/1980  Japan .
61-255060  11/1986  Japan .
1-232886   9/1989   Japan .

*Primary Examiner*—Edward P. Westin
*Assistant Examiner*—Richard Hanig
*Attorney, Agent, or Firm*—Pillsbury Madison & Sutro LLP

[57] ABSTRACT

A light chopper periodically transmits and blocks light, and first a dark current cancelling circuit determines an approximate mean value of the dark current from a photodiode when the light is blocked and cancels thus the mean value from the current signal fed into the integrated circuit, add to this, a differential arithmetic circuit that subtracts the remaining dark current component from the output of the integration circuit, thus the remaining signal indicates only the signal current component.

16 Claims, 6 Drawing Sheets

PHOTODETECTOR AND SOLID-STATE IMAGING APPARATUS

BACKGROUND OF THE INVENTION

1. Field of the Invention

The present invention relates to a photodetector for measuring the intensity of light.

2. Related Background Art

In order to measure the intensity of light, widely used are photodiodes which generate electric charges in response to the quantity of light received thereby and output thus generated charges as a current signal. When such photodiodes are used for accurately measuring the intensity of light, their dark current is always a matter of concern. Hence, there have been proposed systems for reducing or cancelling the dark current according to kinds of photodiodes.

According to one of the proposed systems (hereinafter referred to as conventional method 1), the photodiode is cooled in view of the fact that the dark current is reduced when the operating temperature of the photodiode is lowered. Also, there is a system in which a light chopper is used, a light-shielded dummy photodiode is provided, or an object to be measured is irradiated with pulse light, so as to evaluate, as a dark current, the output current of the photodiode when there is no light incident thereon, and thus evaluated dark current is subtracted from an output current of the photodiode when there is light incident thereon, thereby yielding a current signal corresponding to the intensity of light to be measured (Japanese Patent Application Laid-Open Nos. 1-2322886, 55-160478, and the like; hereinafter referred to as conventional method 2).

Further, an apparatus (hereinafter referred to as conventional example) combining conventional methods 1 and 2 is disclosed in Japanese Patent Application Laid-Open No. 61-255060.

In the conventional photodetectors, since their dark current components are reduced by the above-mentioned systems, there may be shortcomings such as those noted in the following.

In conventional method 1, since it is necessary to provide a cooling section in order to cool the photodiode, the photodetector has a larger size. Further, when the dark current is to be reduced by cooling, a sufficient S/N ratio may not be secured in most cases that the light to be measured is weak.

In conventional method 2, though a favorable S/N ratio can be secured in cases that the current level generated as the light is received (hereinafter also referred to as signal current level) and the dark current level are on the same order, it may not be secured in cases that the signal current level is much lower than the dark current level, e.g., in the case of an InGaAs photodiode.

Accordingly, even the apparatus of the conventional example adopting both of conventional methods 1 and 2 has difficulty in performing accurate measurement when a dark current component occupies the major part of the current from the cooled photodiode.

In view of the foregoing, it is an object of the present invention to provide a photodetector which can secure a favorable S/N ratio even in cases that a dark current component occupies the major part of the output current of a photodiode.

It is another object of the present invention to provide a solid-state imaging apparatus which can capture an incident light image while securing a favorable S/N ratio even in cases where a dark current component occupies the major part of the output current of a photodiode corresponding to a pixel.

SUMMARY OF THE INVENTION

The photodetector in accordance with a first aspect of the present invention comprises (a) a light chopper for periodically transmitting and blocking light; (b) a photodiode which generates an electric charge in response to an intensity of incident light and outputs thus generated electric charge as a current signal; (c) a dark current cancelling circuit which, determines, based on the signal outputted from the photodiode when the light is blocked and a dark current cancel instruction signal is insignificant, an approximate mean value of dark current and cancels thus determined mean value from the signal outputted from the photodiode when the dark current cancel instruction signal is significant; (d) an integrating circuit which, according to an integration instruction signal, integrates the remaining current from the dark current removing circuit and causes thus integrated signal to be held at a first capacitor connected between input and output terminals thereof; (e) a differential arithmetic circuit which, in response to a subtraction instruction signal and based on a signal outputted from the integrating circuit, holds a first value integrated for a predetermined time when the light is blocked and outputs a signal corresponding to a difference between the first value and a second value integrated for the predetermined time when the light is transmitted; and (f) a timing generating circuit which, based on an illuminated state indication signal outputted from the light chopper and in synchronization with a change in the illuminated state indication signal, outputs the integration instruction signal, the dark current cancel instruction signal, and the subtraction instruction signal.

In this photodetector, a light chopper operates so as to alternately and periodically generate a dark state and an illuminated state. Also, the light chopper outputs the illuminated state indication signal, which becomes insignificant and significant respectively in the dark and illuminated states, toward the timing generating circuit.

When the illuminated state indication signal changes from a significant level to an insignificant level, the timing generating circuit causes the integration and dark current cancel instruction signals to be insignificant, thereby allowing the signal outputted from the photodiode to be fed into the dark current cancelling circuit. Based on thus inputted signal as dark current, the dark current cancelling circuit determines the approximate mean value of dark current till the dark current cancel instruction signal becomes significant.

Then, the dark current cancel instruction signal is made significant, whereby the dark current cancelling circuit continuously cancels the determined mean value from the signal outputted from the photodiode.

In this state, the integration instruction signal is made significant, whereby a current signal flowing into the integration circuit is the remaining current obtained by cancel of the mean value of dark current from the current outputted from the photodiode and is integrated by the integrating circuit for a predetermined time, and the resulting electric charges are accumulated and held in the first capacitor. After a lapse of the predetermined time, the subtraction instruction signal is temporarily made significant, and the result of integration by the integrating circuit at this point of time is held by the differential arithmetic circuit.

Thereafter, when the illuminated state instruction signal changes from the insignificant level to the significant level, the electric charges accumulated in the first capacitor are reset. Then, the current obtained by cancel of the mean value of dark current from the current outputted from the photodiode is inputted into and integrated by the integrating circuit for the predetermined time, and the resulting electric charges are accumulated in the first capacitor. After a lapse of the predetermined time, the subtraction instruction signal is temporarily made significant, whereby the differential arithmetic circuit is informed of the result of integration by the integrating circuit at this point of time.

The differential arithmetic circuit informed of this result computes and outputs a difference between the previously held result of integration corresponding to the dark current component alone and the newly informed result of integration corresponding to the sum of the signal component and dark current component.

Thus, in the photodetector in accordance with this aspect, even when the major part of the output current from the photodiode is a dark current component, the majority of the dark current component is initially eliminated by cancel of the approximate mean value of dark current determined at a point of time close to the time of measurement, thereby improving the ratio between the dark current component and the signal current component. Then, the signal component is extracted by subtraction of an estimated remaining dark current component which determines the remaining dark current at a point of time further closer to the time of measurement, whereby the signal component is extracted while a favorable S/N ratio is secured. When thus extracted signal component is measured, the intensity of the light can be determined accurately.

The photodetector in accordance with a second aspect of the present invention comprises (g) a first photodiode which generates an electric charge in response to an intensity of light incident thereon and outputs thus generated electric charge as a current signal; (h) a second photodiode having a light-shield and a dark current characteristic substantially identical to that of the first photodiode; (i) a dark current cancelling circuit which determines, based on the signal outputted from the second photodiode when a dark current cancel instruction signal is insignificant, an approximate mean value of dark current and cancels thus determined mean value from the signal outputted either from the first or second photodiode according to a light detection instruction signal when the dark current cancel instruction signal is significant; (j) an integrating circuit which, according to an integration instruction signal, integrates the remaining current from said dark current cancelling circuit respectively when a light detection instruction signal is significant and insignificant, and causes thus integrated signal to be held at a first capacitor connected between input and output terminals thereof; (k) a differential arithmetic circuit which receives a signal outputted from the integrating circuit, in response to a subtraction instruction signal, holds a first value corresponding to said second photodiode for a predetermined time, and outputs a signal corresponding to a difference between the first value and a second value corresponding to said first photodiode for the predetermined time; and (1) a timing generating circuit for outputting the light detection instruction signal, the integration instruction signal, the dark current cancel instruction signal, and the subtraction instruction signal.

First, in this photodetector, an output terminal of the second photodiode and an input terminal of the integrating circuit are connected to each other. And the integration and dark current cancel instruction signals are made insignificant so that a dark current signal outputted from the second photodiode, with which is light-shielded, is fed into the dark current cancelling circuit. Based on thus inputted dark current signal, the dark current cancelling circuit determines the approximate mean value of dark current signal till the dark current cancel instruction signal becomes significant.

Then, the dark current cancel instruction signal is made significant, whereby the dark current cancelling circuit continuously cancels the determined mean value from the current flowing into the input terminal of the integrating circuit.

In this state, the integration instruction signal is made significant, whereby a current obtained by cancel of the approximate mean value of dark current from the current outputted from the second photodiode is inputted into and integrated by the integrating circuit for a predetermined time, and the resulting electric charges are accumulated and held in the first capacitor. After a lapse of the predetermined time, the subtraction instruction signal is temporarily made significant, and the result of integration by the integrating circuit at this point of time is held by the differential arithmetic circuit.

Thereafter, the electric charges accumulated in the first capacitor are reset, and the light detection instruction signal is made significant, whereby the output terminal of the first photodiode is connected to the input terminal of the integrating circuit. Then, the current obtained by cancel of the approximate mean value of dark current from the current outputted from the first photodiode is inputted into and integrated by the integrating circuit for the predetermined time, and the resulting electric charges are accumulated in the first capacitor. After a lapse of the predetermined time, the subtraction instruction signal is temporarily made significant, whereby the differential arithmetic circuit is informed of the result of integration by the integrating circuit at this point of time.

The differential arithmetic circuit informed of this result computes and outputs a difference between the previously held result of integration corresponding to the dark current component alone and the newly informed result of integration corresponding to the sum of the signal component and dark current component.

Thus, in the photodetector in accordance with this aspect, as in the case of the photodetector in accordance with the first aspect, even when the major part of the output current from the photodiode is a dark current component, the majority of the dark current component is initially eliminated by cancel of the approximate mean value of dark current determined at a point of time close to the time of measurement, thereby improving the ratio between the dark current component and the signal current component. Then, the signal component is extracted by subtraction of an estimated remaining dark current component which determines the remaining dark current at a point of time further closer to the time of measurement, whereby the signal component is extracted while a favorable S/N ratio is secured. When thus extracted signal component is measured, the intensity of the light can be determined accurately.

This photodetector may further comprise a current signal path setting section comprising (i) a second switch, having a first terminal connected to the output terminal of the first photodiode and a second terminal connected to the input terminal of the integrating circuit, adapted to close when the light detection instruction signal is significant; (ii) a third switch, having a first terminal connected to the output terminal of the first photodiode and a second terminal set to a reference potential, adapted to close when the light detection instruction signal is insignificant; (iii) a fourth switch, having a first terminal connected to the output terminal of the second photodiode and a second terminal connected to the input terminal of the integrating circuit, adapted to close when the light detection instruction signal is insignificant; and (iv) a fifth switch, having a first terminal connected to the output terminal of the second photodiode and a second terminal set to the reference potential, adapted to close when the light detection instruction signal is significant.

In this photodetector, the second and fourth switches close exclusively with respect to each other, whereby the output terminals of the first and second photodiodes are connected to the input terminal of the integrating circuit exclusively with respect to each other. Also, the second and third switches close exclusively with respect to each other, while the fourth and fifth switches close exclusively with respect to each other, so that, during the time when one of the output terminals is not connected to the input terminal of the integrating circuit, the voltage applied between its cathode and anode terminals is zero, and all the electric charges generated are released to the reference potential. Consequently, only the electric charges generated in the state where the output terminal is connected to the input terminal of the integrating circuit are outputted toward the integrating circuit.

The photodetector in accordance with a third aspect of the present invention comprises (m) a light source for outputting, in response to a light irradiation instruction signal, probe light to irradiate an object to be measured; (n) a photodiode which generates an electric charge in response to an intensity of light generated upon irradiation with the probe light and outputs thus generated electric charge as a current signal; (o) a dark current cancelling circuit which determines, based on a dark current outputted from the photodiode when the probe light is not irradiated, an approximate mean value of dark current and, in response to a dark current cancel instruction signal, cancels the mean value of dark current from the current outputted from the photodiode; (p) an integrating circuit which, according to an integration instruction signal, integrates the remaining current from the dark current cancelling circuit and causes thus integrated signal to be held at a first capacitor connected between input and output terminals thereof; (q) a differential arithmetic circuit which, in response to a subtraction instruction signal and based on a signal outputted from the integrating circuit, holds a first value for a predetermined time when the probe light is not irradiated and outputs a signal corresponding to a difference between the first value and a second value for the predetermined time when the probe light is irradiated; and (r) a timing generating circuit for outputting the light irradiation instruction signal, the integration instruction signal, the dark current cancel instruction signal, and the subtraction instruction signal.

In this photodetector, the light irradiation instruction signal is initially made insignificant, thereby attaining a state where no light is made incident thereon from the object to be measured.

In this state, the integration and dark current cancel instruction signals are made insignificant, thereby allowing the dark current signal outputted from the photodiode to be fed into the dark current cancelling circuit. Based on thus inputted dark current signal, the dark current cancelling circuit determines the approximate mean value of dark current till the dark current cancel instruction signal becomes significant.

Then, the dark current cancel instruction signal is made significant, whereby the dark current cancelling circuit continuously cancels the determined approximate mean value of dark current from the current signal flowing into an input terminal of the integrating circuit.

In this state, the integration instruction signal is made significant, whereby a current signal obtained by cancel of the approximate mean value of dark current from the current outputted from the photodiode is inputted into and integrated by the integrating circuit for a predetermined time, and the resulting electric charges are accumulated and held in the first capacitor. After a lapse of the predetermined time, the subtraction instruction signal is temporarily made significant, and the result of integration by the integrating circuit at this point of time is held by the differential arithmetic circuit.

Thereafter, the light irradiation instruction signal is made significant so that the light source outputs the probe light, thereby yielding a state where the light is incident on the photodiode. Then, the electric charges accumulated in the first capacitor are reset. Subsequently, the current signal obtained by cancel of the approximate mean value of dark current from the current outputted from the photodiode is inputted into and integrated by the integrating circuit for the predetermined time, and the resulting electric charges are accumulated in the first capacitor. After a lapse of the predetermined time, the subtraction instruction signal is temporarily made significant, whereby the differential arithmetic circuit is informed of the result of integration by the integrating circuit at this point of time.

The differential arithmetic circuit informed of this result computes and outputs a difference between the previously held result of integration corresponding to the dark current component alone and the newly informed result of integration corresponding to the sum of the signal component and dark current component.

Thus, in the photodetector in accordance with this aspect, even when the major part of the output current from the photodiode is a dark current component, the majority of the dark current component is initially eliminated by cancel of the approximate mean value of dark current determined at a point of time close to the time of measurement, thereby improving the ratio between the dark current component and the signal current component. Then, the signal component is extracted by subtraction of an estimated remaining dark current component which determines the remaining dark current at a point of time further closer to the time of measurement, whereby the signal component is extracted while a favorable S/N ratio is secured. When thus extracted signal component is measured, the intensity of the light can be determined accurately.

The photodetector in accordance with each of the above-mentioned aspects may comprise (i) a photodiode having a cathode terminal set to a reference potential and (ii) an integrating circuit comprising an operational amplifier having a negative input terminal for receiving the current signal outputted from each photodiode and a positive input terminal set to the reference potential.

The dark current generated in the photodiode becomes greater as the bias voltage applied between its cathode and anode terminals is higher.

In this photodetector, the cathode terminal of the photodiode is set to the reference potential, while the anode terminal, acting as the output terminal, is connected to the negative input terminal of the operational amplifier of the integrating circuit, which is in a state of imaginary short with respect to the reference potential. Consequently, the bias voltage applied between the cathode and anode terminals can be reduced substantially to its limit. Accordingly, the absolute amount of dark current can be reduced. As a result, the signal component to be extracted has an improved S/N ratio.

Also, in the photodetector in accordance with the present invention, the dark current cancelling circuit may comprise (i) a field-effect transistor having a source terminal connected to the input terminal of the integrating circuit and a drain terminal set to a reference potential; (ii) a second capacitor having a first terminal connected to a gate terminal of the field-effect transistor and a second terminal set to the reference potential; and (iii) a first switch, having a first terminal connected to the gate terminal of the field-effect transistor and a second terminal connected to the output terminal of the integrating circuit, adapted to open and close in response to the dark current cancel instruction signal.

In this photodetector, in order to determine the approximate mean value of dark current, a dark current from the photodiode in a dark state is fed into the source terminal of the field-effect transistor and, by way of the first switch adapted to close when the dark current cancel instruction signal is insignificant, the output signal of the integrating circuit at the time of non-integrating operation is fed into the gate terminal of the field-effect transistor and the first terminal of the second capacitor. As a result, a potential level corresponding to the approximate mean value of the dark current from the photodiode in a period of time when the dark current cancel instruction signal is made insignificant is generated at the first terminal of the second capacitor, i.e., at the gate terminal of the field-effect transistor, and a current level corresponding to this potential is cancelled, by way of the field-effect transistor, from the current signal flowing into the current signal input terminal of the integrating circuit.

Also, when the dark current cancel instruction signal is made significant, the previous potential level corresponding to the approximate mean value of the dark current from the photodiode is held at the first terminal of the second capacitor. Accordingly, in the state where the dark current cancel instruction signal is significant, the approximate mean value of dark current in the previous state where the dark current cancel instruction signal is insignificant is continuously canceled from the current signal flowing into the current signal input terminal of the integrating circuit.

In these photodetectors, the light may be an infrared ray, while the photodiode may be comprised of InGaAs.

In the InGaAs photodiode which is sensitive to infrared rays, the major part of its output current signal is a dark current component. Accordingly, the configuration of the present invention is preferably employed therein in particular.

In the solid-state imaging apparatus in accordance with the present invention, the photodetectors in accordance with the present invention are arranged in a one-dimensional or two-dimensional form.

In this solid-state imaging apparatus, the photodetectors respectively corresponding to pixels arranged in a one-dimensional or two-dimensional form are constituted by the photodetectors in accordance with the present invention, whereby an input image can be captured appropriately while a favorable S/N ratio is secured in each pixel.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

In the following, embodiments of the photodetector and solid-state imaging apparatus in accordance with the present invention will be explained with reference to the accompanying drawings. In the explanation of the drawings, elements identical to each other will be referred to with marks identical to each other, without their overlapping descriptions repeated.

(First Embodiment)

Figure 1:
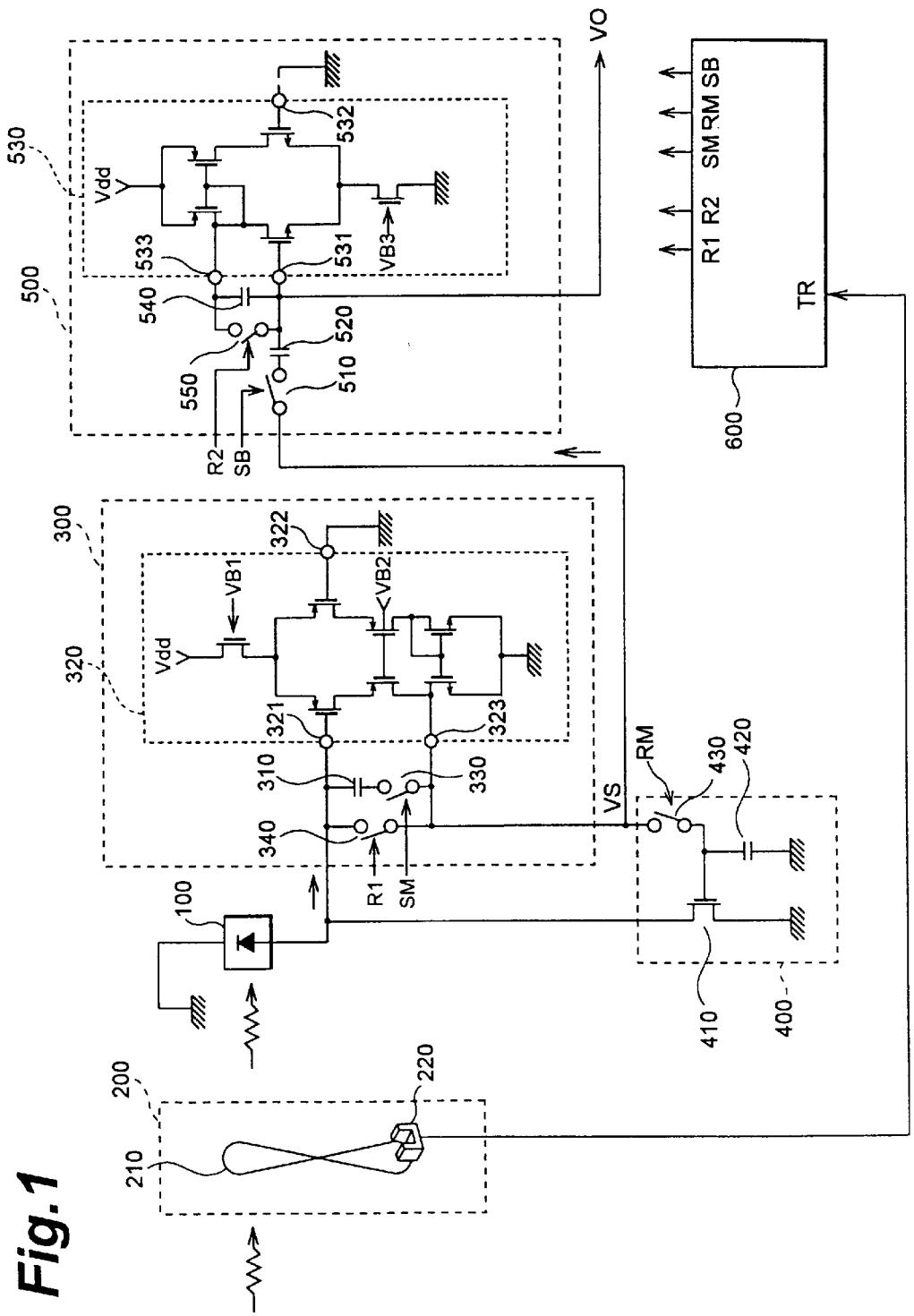
FIG. 1 is a configurational view showing the photodetector in accordance with a first embodiment of the present invention.

FIG. 1 is a configurational view showing a first embodiment of the photodetector in accordance with the present invention. As shown in FIG. 1, this photodetector comprises (a) a light chopper 200 for periodically transmitting and blocking light; (b) a photodiode 100 adapted to generate an electric charge in response to an intensity of light incident thereon by way of the light chopper 200 and output thus generated electric charge as a current signal; (c) an integrating circuit 300 which receives the signal outputted from the photodiode 100 integrates, in response to an integration instruction signal SM, thus received signal in a capacitor 10 connected between its input and output terminals, and releases, in response to a reset instruction signal R1, the electric charge accumulated in the capacitor 310; (d) a dark current cancelling circuit 400 which receives a dark current signal outputted from the photodiode 100 at the time when the light is blocked, thereby determining an approximate mean value of dark current and, in response to a dark current cancel instruction signal RM, cancels the approximate mean value of dark current from the current fed into the integrating circuit 300; (e) a differential arithmetic circuit 500 which receives an output signal from the integrating circuit, holds, in response to a subtraction instruction signal SB, a value V1 of output signal of the integrating circuit 300 for a predetermined time T in a dark state (where the light is blocked), outputs a signal corresponding to a difference between the value V1 and a value V2 of output signal of the integrating circuit 300 for the predetermined time T in a illuminated state (where the light is transmitted), and resets the held value in response to a reset instruction signal R2; and (f) a timing generating circuit 600 which receives a light illuminated state indication signal TR outputted from the light chopper 200 and, in synchronization with the illuminated state indication signal TR, outputs the integration instruction signal SM, the reset instruction signal R1, the dark current cancel instruction signal RM, the subtraction instruction signal SB, and the reset instruction signal R2.

In the case of infrared measurement, an InGaAs photodiode can favorably be employed. Here, assumed in the following explanation is a case where a dark current component occupies the major part of the current outputted from the photodiode 100.

As shown in FIG. 1, the cathode terminal of the photodiode 100 is grounded, and the photodiode 100 outputs the current signal from its anode terminal.

This while its anode terminal, acting as the output terminal, is connected to a negative input terminal 321 of an operational amplifier 320 of the integrating circuit 300 which is in a state of imaginary short with respect to the ground level, whereby the bias voltage applied between the cathode and anode terminals is reduced substantially to its limit. Accordingly, the absolute amount of dark current generated is lowered.

The light chopper 200 comprises (i) a light blade 210 disposed in an optical path of the light to the photodiode 100; and (ii) a photo-interrupter 220 which detects whether the light is in a blocking or transmitting state according to the light blade 210 and outputs the illuminated state indication signal TR that becomes significant in the illuminated state.

The integrating circuit 300 comprises (i) the operational amplifier 320 having the negative input terminal 321 for receiving the current signal outputted from the photodiode 100 and a grounded positive input terminal 322; (ii) the capacitor 310 having a first terminal connected to the negative input terminal 321 of the operational amplifier 320; (iii) a switch 330 comprised of one or multiple field-effect transistor(s) hereinafter the same, having a first terminal connected to the second terminal of the capacitor 310 and a second terminal connected to an output terminal 323 of the operational amplifier 320, adapted to open and close in response to the integration instruction signal SM; (iv) a switch 340, having a first terminal connected to the negative input terminal 321 of the operational amplifier 320 and a second terminal connected to the output terminal 323 of the operational amplifier 320, adapted to open and close in response to the reset instruction signal R1.

The dark current cancelling circuit 400 comprises (i) a field-effect transistor 410 having a source terminal connected to the input terminal of the integrating circuit 300 and a grounded drain terminal; (ii) a capacitor 420 having a first terminal connected to a gate terminal of the field-effect transistor 410 and a grounded second terminal; and (iii) a switch 430, having a first terminal connected to the gate terminal of the field-effect transistor 410 and a second terminal connected to the output terminal of the integrating circuit 300, adapted to open and close in response to the dark current cancel instruction signal RM.

The differential arithmetic circuit 500 comprises (i) a switch 510, having a first terminal for receiving the signal outputted from the integrating circuit 300, adapted to open and close in response to the subtraction instruction signal SB; (ii) a capacitor 520 having a first terminal for receiving the signal outputted from a second terminal of the switch 510; (iii) an operational amplifier 530 having a negative input terminal 531 for receiving the current signal outputted from the second terminal of the capacitor 520 and a grounded positive input terminal 532; (iv) a capacitor 540 having a first terminal connected to the negative input terminal 531 of the operational amplifier 530 and a second terminal connected to an output terminal 533 of the operational amplifier 530; and (v) a switch 550, having a first terminal connected to the negative input terminal 531 of the operational amplifier 530 and a second terminal connected to the output terminal 533 of the operational amplifier 530, adapted to open and close in response to the reset instruction signal R2.

Figure 2:
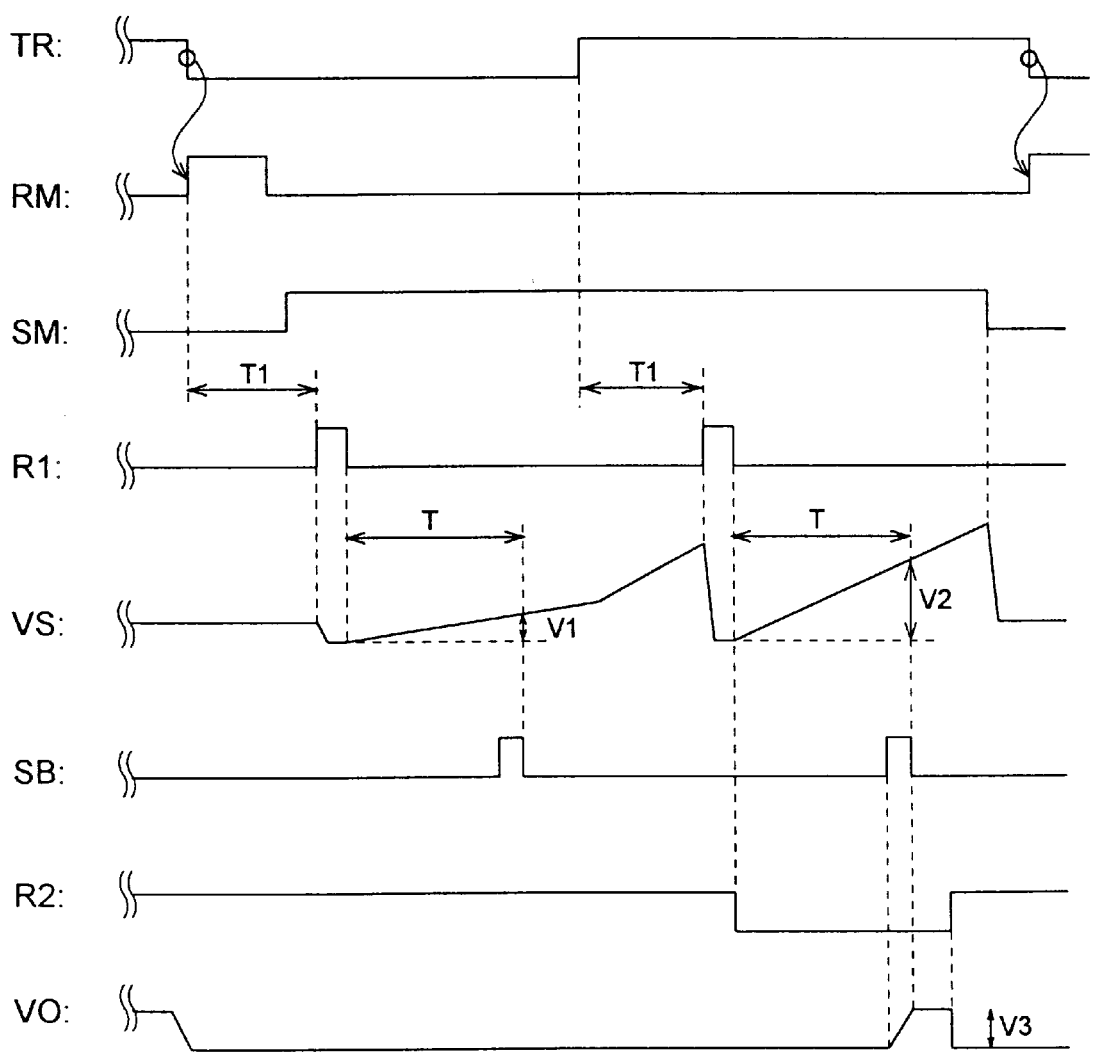
FIG. 2 is a timing chart for explaining an operation of the photodetector shown in FIG. 1.

The photodetector in accordance with this embodiment measures the intensity of light in the following manner. FIG. 2 is a timing chart showing an operation of the photodetector in accordance with this embodiment. In FIG. 2, each of the illuminated state indication signal TR, integration instruction signal SM, reset instruction signal R1, subtraction instruction signal SB, and reset instruction signal R2 is significant at a higher level, whereby the signals except for the illuminated state indication signal TR close their corresponding switches for controlling opening and closing actions; whereas each of them is insignificant at a lower level, whereby the signals except for the illuminated state indication signal TR open their corresponding switches for controlling opening and closing actions. By contrast, the dark current cancel instruction signal RM is insignificant at a higher level, where it closes the switch 430; whereas it is significant at a lower level, where it opens the switch 430.

In the photodetector in accordance with this embodiment, according to the operation of the light chopper 200, the dark state and illuminated state are periodically generated for the photodiode 100 with respect to the light to be measured. This alternating and periodic change of the dark and illuminated states is detected by the photo-interrupter 220 and sent to the timing generating circuit 600 as the illuminated state indication signal TR.

When the illuminated state indication signal TR changes from the significant level to the insignificant level, i.e., when a state where the light is not incident on the photodiode 100 is started, the timing generating circuit 600 causes the dark current cancel instruction signal RM to become insignificant, thereby opening the switch 430.

In this state, when a dark current is generated in the photodiode 100, this dark current flows by way of the field-effect transistor 410. Then, a gate potential caused by the approximate mean value of dark current to flow by way of the field-effect transistor 410 is generated at the first terminal of the capacitor 420.

Then, the timing generating circuit 600 causes the dark current cancel instruction signal RM to become significant. As a result, the gate potential corresponding to the approximate mean value of dark current immediately before the dark current cancel instruction signal RM is made significant is held at the first terminal of the capacitor 420. Thereafter, the dark current cancelling circuit 400 continuously subtracts the approximate mean value of dark current from the current flowing into the input terminal of the integrating circuit 300.

Subsequently, the timing generating circuit 600 causes the integration instruction signal SM to become significant and then temporarily makes the reset instruction signal R1 significant after the time T1 from when TR changes insignificant.

Thereafter, for the time T, a current signal obtained after the approximate mean value of dark current is cancelled from the dark current outputted from the photodiode 100 is fed into the integrating circuit 300, and electric charges which have flowed therein are accumulated in the capacitor 310. The electric charges accumulated in the capacitor 310 (VS) correspond to an integrated value with respect to the time T of the dark current that has not been subtracted by the dark current cancelling circuit 400.

Then, the timing generating circuit 600 temporarily causes the subtraction instruction signal SB to become significant so as to temporarily close the switch 510 of the differential arithmetic circuit 500, thus allowing the output value V1 of the integrating circuit 300 at this point of time to be held at the capacitor 520 of the differential arithmetic circuit 500.

Thereafter, the illuminated state indication signal TR changes from the insignificant level to the significant level, i.e., a state where the light is incident on the photodiode is started. As a result, a current signal including a signal current component and a dark current component is outputted from the photodiode 100.

After the lapse of an appropriate time T1 from the insignificant-to-significant change of the illuminated state indication signal TR, the reset instruction signal R1 is temporarily made significant, whereby the electric charges accumulated in the capacitor 310 are released. Then, for the time T thereafter, a current signal obtained after the approximate mean value of dark current is cancelled from the current outputted from the photodiode 100 is fed into the integrating circuit 300, and electric charges which have flowed therein are accumulated in the capacitor 310 (VS). The electric charges accumulated in the capacitor 310 correspond to a sum of the integrated value with respect to the time T of the dark current that has not been subtracted by the dark current cancelling circuit 400 and the integrated value with respect to the time T of the signal current corresponding to the light received by the photodiode 100.

Though the current signal obtained by cancel of the approximate mean value of dark current from the current outputted from the photodiode 100 is the sum of the dark current component and the signal current component, the ratio of the dark current component in thus obtained current signal as a whole is remarkably lower than the ratio of the dark current component in the current signal outputted from the photodiode 100.

As the result of integration with respect to the time T of the current signal obtained by cancel of the approximate mean value of dark current from the current outputted from the photodiode 100, the value V2 of the output signal of the integrating circuit 300 is:

$$V2 = V1' + V3 \quad (1)$$

wherein V1' is a value attributable to the dark current component, and V3 is a value attributable to the signal current component. As mentioned above, since the dark current in the current signal at the time when it is outputted from the photodiode 100 has substantially been cancelled, the relationship of V1'>>V3 is not established anymore.

Here, as mentioned above, since the output value of the integrating circuit 300 corresponding to the integration with respect to the time T of the current obtained by cancel of the approximate mean value of dark current from the dark current outputted from the same photodiode 100 is V1, V1'=V1. Thus, $$V2 = V1 + V3 \quad (2)$$

represents a very close approximation. This approximation will be employed hereinafter.

In parallel with the integrating operation by the integrating circuit 300 of the current signal obtained by cancel of the approximate mean value of dark current from the current outputted from the photodiode 100, the reset instruction signal R2 is made insignificant, thereby opening the switch 550.

After the integration with respect to the time T of the current signal obtained by cancel of the approximate mean value of dark current from the current outputted from the photodiode 100, the subtraction instruction signal SB is temporarily made significant, so as to temporarily close the switch 510 of the differential arithmetic circuit 500, thus transferring the output level V2 of the integrating circuit 300 to the capacitor 520. As a result, electric charges corresponding to the value V3 (=V2−V1) are accumulated in the capacitor 540 (V0), and the output value V3 is outputted as an output of the differential arithmetic circuit 500. From equation (2), it can be seen that the output value V3 reflects the intensity of the light.

Here, as mentioned above, since V1>>V3 is not established, the value V3 determined by computing of the difference between the values V2 and V1 secures a favorable S/N ratio and reflects the intensity of the light. Accordingly, when the value V3 is sampled, the intensity of the light can be determined with a high S/N ratio.

After the value V3 is sampled, the timing generating circuit 600 causes the individual signals to resume their initial states, thereby preparing for the next measurement.

(Second Embodiment)

Figure 3:
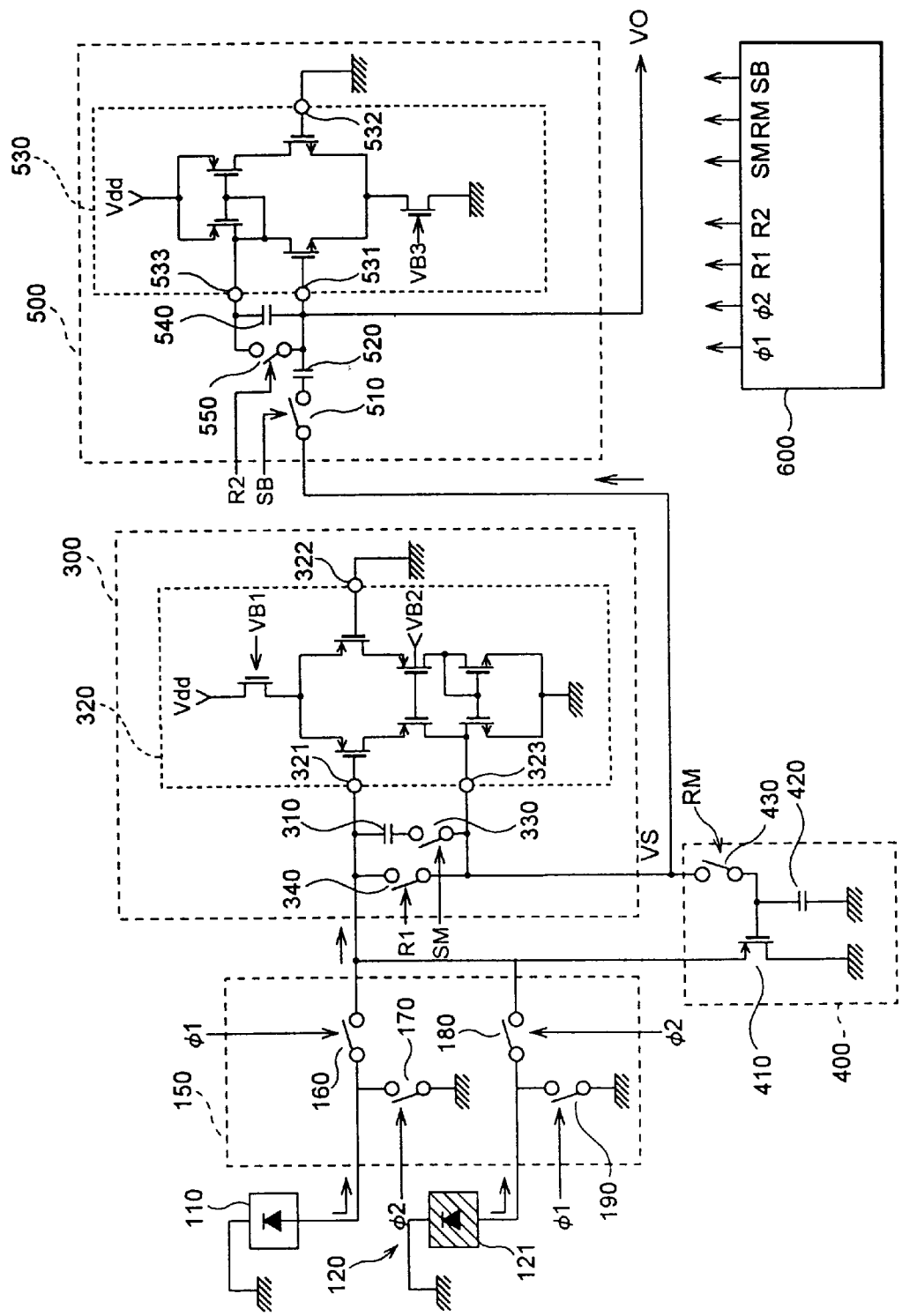
FIG. 3 is a configurational view showing the photodetector dance with a second embodiment of the present invention.

FIG. 3 is a configurational view showing a second embodiment of the photodetector in accordance with the present invention. As shown in FIG. 3, this photodetector is different from that of the first embodiment shown in FIG. 1 in that it uses, in place of the single photodiode 100 and the light chopper 200, (g) a photodiode 110 adapted to generate an electric charge in response to an intensity of light incident thereon and output thus generated electric charge as a current signal; (h) a light-shielded photodiode 120 having a dark current characteristic substantially identical to that of the photodiode 110; and (i) a current signal selecting circuit 150 which receives a light detection instruction signal Φ1 and a light non-detection instruction signal Φ2 and outputs the output current signals of the photodiodes 110 and 120 respectively when the light detection instruction signal Φ1 and light non-detection instruction signal Φ2 are significant. Also, the timing generating circuit 600 differs from that of the first embodiment in that it outputs the light detection instruction signal Φ1, the light non-detection instruction signal Φ2, the integration instruction signal SM, the reset instruction signal R1, the dark current cancel instruction signal RM, the subtraction instruction signal SB, and the reset instruction signal R2.

Though the photodiodes 110 and 120 differ from each other in that the photodiode 120 is with a light-shielding material 121, they have substantially the same dark current characteristic. Such a consistency in dark current characteristic can be attained when the photodiodes 110 and 120 are respectively formed in neighboring areas on the same substrate by the same process. Here, Au or Al is preferably employed as the light-shielding material.

In the case of infrared measurement, a InGaAs photodiodes can favorably be employed. Here, assumed in the following explanation is a case where a dark current component occupies the major part of the current signal outputted from the photodiode 110.

The current signal selecting circuit 150 comprises (i) a switch 160, having a first terminal connected to the output terminal of the photodiode 110 and a second terminal connected to the input terminal of the integrating circuit 300, adapted to close when the light detection instruction signal Φ1 is significant; (ii) a switch 170, having a first terminal connected to the output terminal of the photodiode 110 and a grounded second terminal, adapted to close when the light non-detection instruction signal Φ2 is significant; (iii) a switch 180, having a first terminal connected to the output terminal of the photodiode 120 and a second terminal connected to the input terminal of the integrating circuit 300, adapted to close when the light non-detection instruction signal Φ2 is significant; and (iv) a switch 190, having a first terminal connected to the output terminal of the photodiode 120 and a grounded second terminal, adapted to close when the light detection instruction signal Φ1 is significant.

Figure 4:
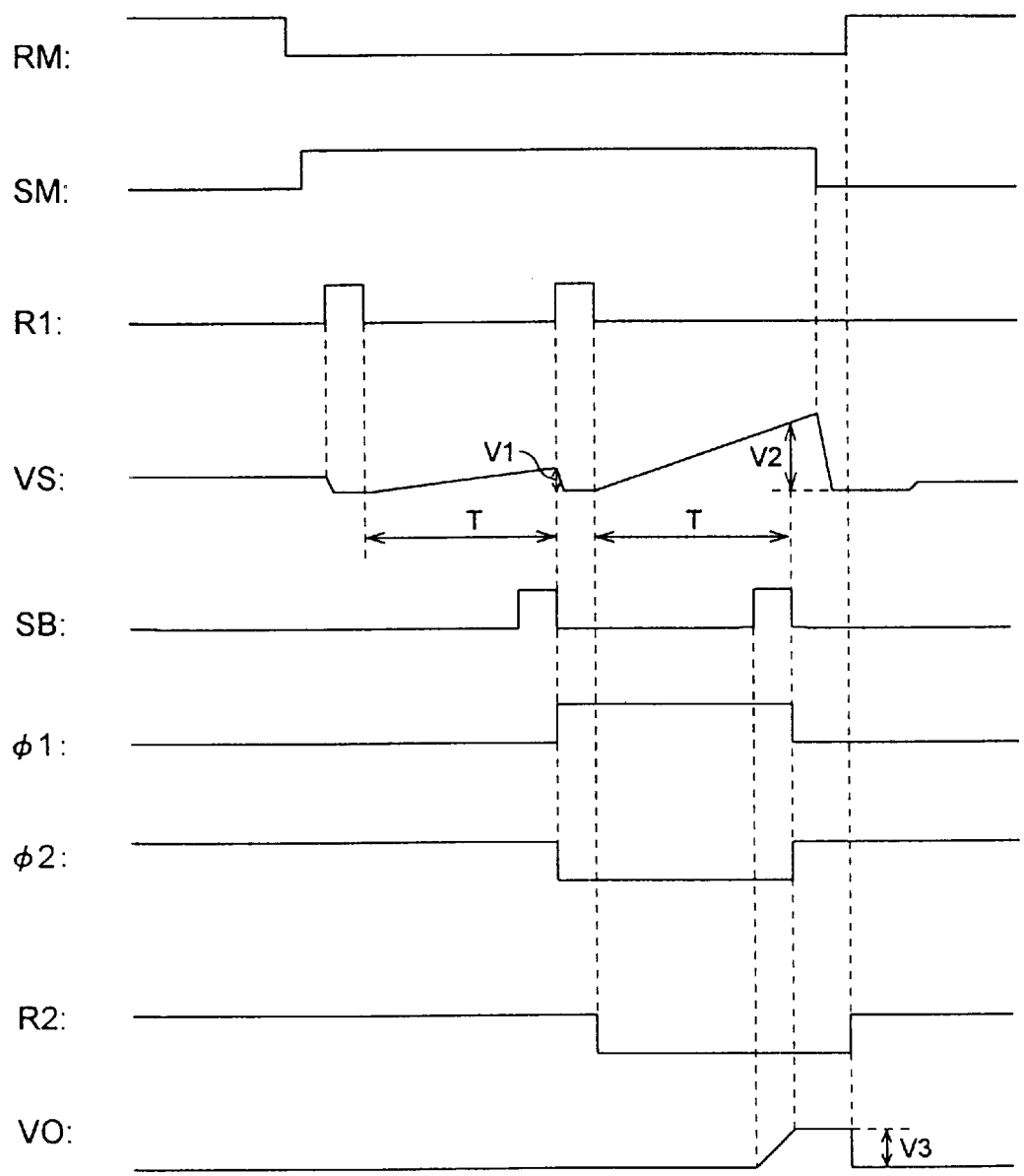
FIG. 4 is a timing chart for explaining an operation of the photodetector shown in FIG. 3.

The photodetector in accordance with this embodiment measures the intensity of light in the following manner. FIG. 4 is a timing chart showing an operation of the photodetector in accordance with this embodiment. Here, though the signals and switch operations are basically the same as those in the first embodiment, each of the light detection instruction signal Φ1 and light non-detection instruction signal Φ2, which do not exist in the first embodiment, is significant and insignificant respectively at higher and lower levels, thereby closing their corresponding switches only when significant.

First, in the photodetector in accordance with this embodiment, the timing generating circuit 600 causes the light detection instruction signal Φ1, the integration instruction signal SM, the reset instruction signal R1, the dark current cancel instruction signal RM, and the subtraction instruction signal SB to become insignificant, while making the light non-detection instruction signal Φ2 and the reset instruction signal R2 significant. These signals are outputted, thereby attaining an initial state. As a result, the switches 160 and 190 are opened, the switches 170 and 180 are closed, the output terminal of the photodiode 110 is grounded, and the output terminal of the photodiode 120 is connected to the input terminal of the integrating circuit 300 and the source terminal of the field-effect transistor 410 of the dark current cancelling circuit 400. Also, since the switch 430 is closed, the output terminal of the integrating circuit 300 is connected to the gate terminal of the field-effect transistor 410 and the first terminal of the capacitor 420. Also, the switch 550 is closed.

In this state, while the cathode terminal of the photodiode 120 is grounded, its anode terminal, acting as the current signal output terminal, is connected to the negative input terminal 321 of the operational amplifier 320 of the integrating circuit 300, which is in a state of imaginary short with respect to the ground level, whereby the bias voltage applied between the cathode and anode terminals is reduced substantially to its limit. Accordingly, the absolute amount of dark current generated is lowered.

This state is equivalent to the dark state of the photodiode 100 caused by the operation of the light chopper 210 in the first embodiment. Accordingly, in this state, when a dark current is generated in the photodiode 120, a gate potential caused by the approximate mean value of dark current to flow by way of the field-effect transistor 410 is generated at the first terminal of the capacitor 420.

Then, the timing generating circuit 600 causes the dark current cancel instruction signal RM to become significant. As a result, thereafter, as with the above-mentioned first embodiment, the dark current cancelling circuit 400 continuously subtracts the approximate mean value of dark current from the current flowing into the input terminal of the integrating circuit 300.

Subsequently, the timing generating circuit 600 causes the integration instruction signal SM to become significant and then temporarily makes the reset instruction signal R1 significant.

After the time T, the timing generating circuit 600 temporarily causes the subtraction instruction signal SB to become significant so as to temporarily close the switch 510 of the differential arithmetic circuit 500. As a result, electric charges corresponding to an integrated value with respect to the time T of the dark current that has not been subtracted by the dark current cancelling circuit 400 are accumulated in the capacitor 310. Then, the output value V1 of the integrating circuit 300 at the time of this switching operation is held at the capacitor 520 of the differential arithmetic circuit 500.

Subsequently, the timing generating circuit 600 causes the light non-detection instruction signal Φ2 to become insignificant, while making the light detection instruction signal Φ1 significant. As a result, the switches 160 and 190 are closed, the switches 170 and 180 are opened, the output terminal of the photodiode 120 is grounded, and the output terminal of the photodiode 110 is connected to the input terminal of the integrating circuit 300 and the source terminal of the field-effect transistor 410 of the dark current cancelling circuit 400.

In this state, while the cathode terminal of the photodiode 110 is grounded, its anode terminal, acting as the current signal output terminal, is connected to the negative input terminal 321 of the operational amplifier 320 of the integrating circuit 300, which is in a state of imaginary short with respect to the ground level, whereby the bias voltage applied between the cathode and anode terminals is reduced substantially to its limit, as in the case of the photodiode 120 mentioned above. Accordingly, a dark current generating condition similar to that of the photodiode 120 is realized, and the absolute amount of dark current generated is lowered.

Then, the reset instruction signal R1 is temporarily made significant, thereby releasing the electric charges accumulated in the capacitor 310. The electric charges accumulated in the capacitor 310 for the time T thereafter correspond to a sum of the integrated value with respect to the time T of the dark current that has not been subtracted by the dark current cancelling circuit 400 and the integrated value with respect to the time T of the signal current corresponding to the light received by the photodiode 110.

The ratio of the dark current component in thus obtained current signal as a whole is remarkably lower than the ratio of the dark current component in the current outputted from the photodiode 110.

In parallel with the integrating operation by the integrating circuit 300 of the current signal obtained by cancel of the approximate mean value of dark current from the current outputted from the photodiode 110, the reset instruction signal R2 is made insignificant, thereby opening the switch 550.

After the integration with respect to the time T of the current signal obtained by cancel of the approximate mean value of dark current from the current outputted from the photodiode 110, the subtraction instruction signal SB is temporarily made significant so as to temporarily close the switch 510 of the differential arithmetic circuit 500, whereby the output value V2 of the integrating circuit 300 is transferred to the capacitor 520. As a result, as in the case of the first embodiment, electric charges corresponding to the value attributable to the signal current component V3 (=V2−V1) are accumulated in the capacitor 540 (V0), and the output value V3 is outputted as an output of the differential arithmetic circuit 500. From equation (2), it can be seen that the output value V3 reflects the intensity of the light.

Since the value V3 secures a favorable S/N ratio and reflects the intensity of the light, the intensity of the light can be determined with a high S/N ratio when the value V3 is sampled.

After the value V3 is sampled, the timing generating circuit 600 causes the individual signals to resume their initial states, thereby preparing for the next measurement.

(Third Embodiment)

Figure 5:
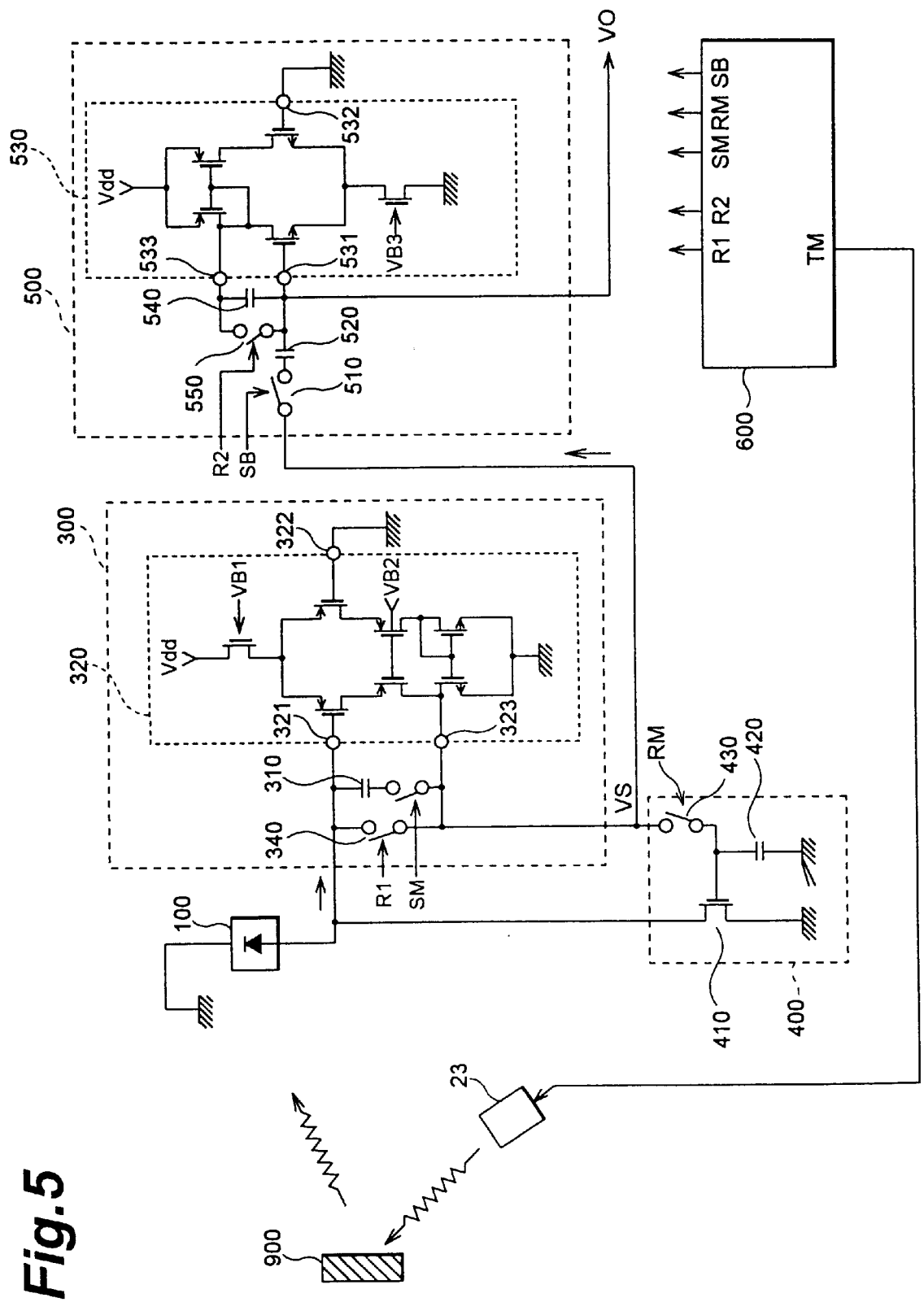
FIG. 5 is a configurational view showing the photodetector in accordance with a third embodiment of the present invention.

FIG. 5 is a configurational view showing a third embodiment of the photodetector in accordance with the present invention. As shown in FIG. 5, this photodetector has a basic configuration identical to that of the first embodiment shown in FIG. 1 except that, in place of the light chopper 200, a light source 230 for outputting probe light to irradiate an object to be measured 900 in response to a light irradiation instruction signal TM is provided. This light irradiation instruction signal TM is controlled by the timing generating circuit 600.

Assumed in the following explanation is a case that a dark current component occupies the major part of the current outputted from the photodiode 100.

Figure 6:
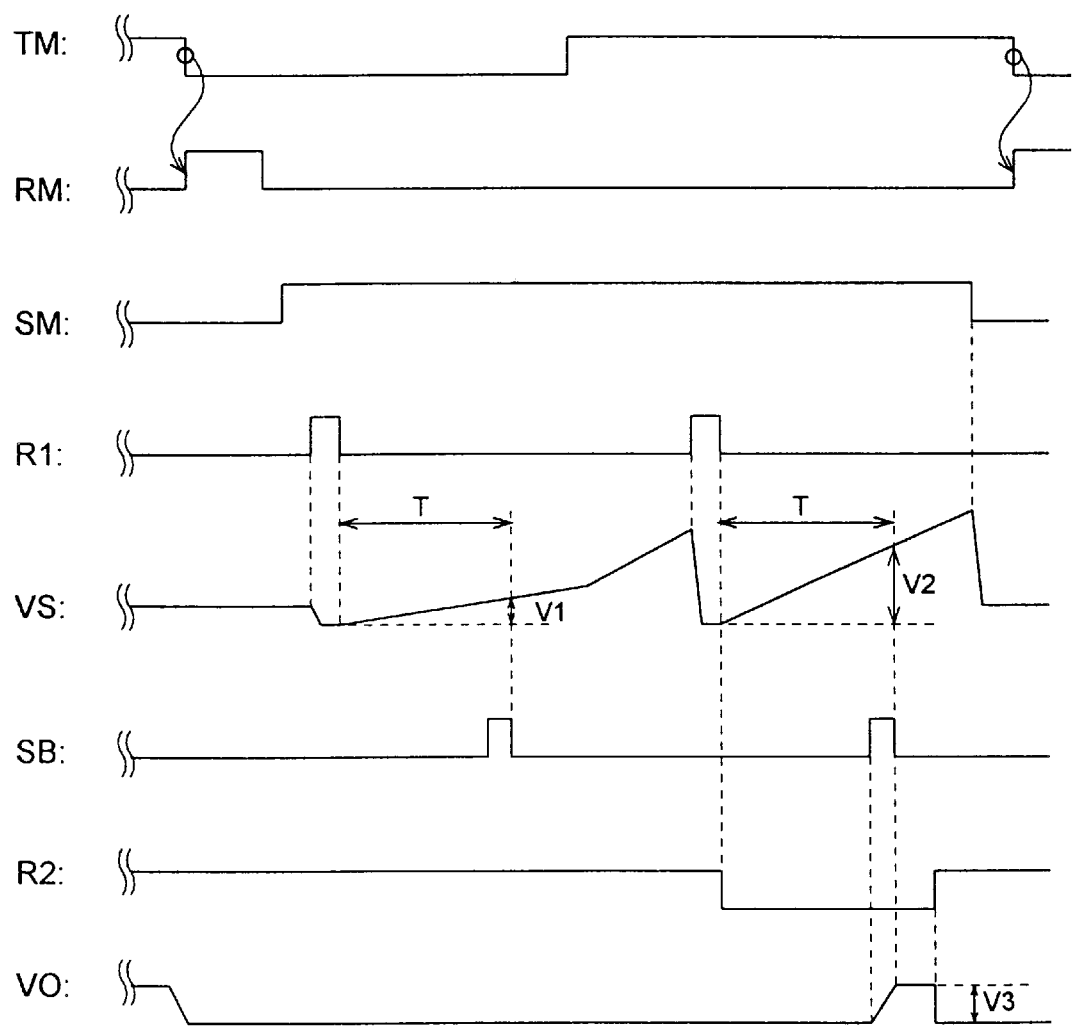
FIG. 6 is a timing chart for explaining an operation of the photodetector shown in FIG. 5.

The photodetector in accordance with this embodiment measures the intensity of light in the following manner. FIG. 6 is a timing chart showing an operation of the photodetector in accordance with this embodiment. Here, though most of the signals and switch operations are identical to those in the first embodiment, the light irradiation instruction signal TM is significant and insignificant respectively at higher and lower levels.

First, in the photodetector in accordance with this embodiment, the light irradiation instruction signal TM is made insignificant, thereby attaining a state where the light is not incident on the photodiode 100. Then, the timing generating circuit 600 causes the dark current cancel instruction signal RM to become insignificant, thereby opening the switch 430.

This state is equivalent to the dark state in the first embodiment. In this state, when a dark current is generated in the photodiode 100, a gate potential caused by the approximate mean value of dark current to flow by way of the field-effect transistor 410 is generated at the first terminal of the capacitor 420.

Then, the timing generating circuit 600 causes the dark current cancel instruction signal RM to become significant. Thereafter, the dark current cancelling circuit 400 continuously subtracts the approximate mean value of dark current from the current flowing into the input terminal of the integrating circuit 300.

Subsequently, the timing generating circuit 600 causes the integration instruction signal SM to become significant and then temporarily makes the reset instruction signal R1 significant.

The electric charges accumulated in the capacitor 310 for the time T thereafter correspond to an integrated value with respect to the time T of the dark current that has not been subtracted by the dark current cancelling circuit 400.

Then, the timing generating circuit 600 temporarily causes the subtraction instruction signal SB to become significant so as to temporarily close the switch 510 of the differential arithmetic circuit 500, whereby the output value V1 of the integrating circuit 300 at this point of time is held at the capacitor 520 of the differential arithmetic circuit 500.

Thereafter, the light irradiation instruction signal TM is made significant so as to irradiate the object to be measured 900 with the probe light, thereby attaining a state where the light is incident on the photodiode 100 (corresponding to the illuminated state in the first embodiment). As a result, a current signal including a signal current component and a dark current component is outputted from the photodiode 100.

Subsequently, the reset instruction signal R1 is temporarily made significant, thereby releasing the electric charges accumulated in the capacitor 310. The electric charges accumulated in the capacitor 310 for the time T thereafter correspond to a sum of the integrated value with respect to the time T of the dark current that has not been subtracted by the dark current cancelling circuit 400 and the integrated value with respect to the time T of the signal current corresponding to the light received by the photodiode 100.

In the current signal obtained by cancel of the approximate mean value of dark current from the current outputted from the photodiode 100, the ratio of the dark current component in thus obtained current as a whole is remarkably lower than the ratio of the dark current component in the current outputted from the photodiode 100.

In parallel with the integrating operation by the integrating circuit 300 of the current signal obtained by cancel of the approximate mean value of dark current from the current outputted from the photodiode 100, the reset instruction signal R2 is made insignificant, thereby opening the switch 550.

After the integration with respect to the time T of the current signal obtained by cancel of the approximate mean value of dark current from the current outputted from the photodiode 100, the subtraction instruction signal SB is temporarily made significant so as to temporarily close the switch 510 of the differential arithmetic circuit 500, whereby the output value V2 of the integrating circuit 300 is transferred to the capacitor 520. As a result, electric charges corresponding to the value attributable to the signal current component V3 (=V2−V1) are accumulated in the capacitor 540, and the output value V3 is outputted as an output of the differential arithmetic circuit 500. From equation (2), it can be seen that the output value V3 reflects the intensity of the light. Accordingly, the intensity of the light can be determined with a high S/N ratio when the value V3 is sampled.

After the value V3 is sampled, the timing generating circuit 600 causes the individual signals to resume their initial states, thereby preparing for the next measurement.

Namely, in each of these embodiments, even when the major part of the output current from the photodiode is occupied by a dark current component, the photodetector in accordance with the present invention initially cancels therefrom an approximate mean value of dark current determined at a point of time close to the time of measurement, thereby improving the ratio between the dark current component and the signal current component. Then, the signal component is extracted by subtraction of an estimated remaining dark current component which determines the remaining dark current at a point of time further closer to the time of measurement, whereby the signal component is extracted while a favorable S/N ratio is secured. When thus extracted signal component is measured, the intensity of the light can be determined accurately.

Here, in the case where the photodetectors in accordance with any of these embodiments are arranged in a one-dimensional or two-dimensional form so as to respectively correspond to pixels, even when a photodiode in which a dark current component occupies the major part of the output current signal therefrom is used, a one-dimensional or two-dimensional solid-state imaging device for appropriately capturing an input image while securing a favorable S/N ratio can be realized.

Without being restricted to the above-mentioned embodiments, the present invention can be modified in various manners. For example, even in the cases where the dark current component does not occupy the major part of the output current from the photodiode, the photodetector in accordance with the present invention can be used, whereby the intensity of light can be determined with a very high accuracy.

As explained in detail in the foregoing, in the photodetector in accordance with the present invention, the respective states where the light is incident and not incident on a photodiode are periodically generated in a light chopper or the like, so that the mean value of dark current generated by the photodiode in the state where the light is not incident thereon is initially eliminated, thereby improving the ratio between the dark current component and the signal current component. Then, the signal component is extracted by subtraction of an estimated remaining dark current component which determines the remaining dark current at a point of time further closer to the time of measurement, whereby the signal component is extracted while a favorable S/N ratio is secured.

Alternatively, a photodiode for receiving the light and a light-shielded photodiode having a dark current characteristic substantially the same as that of the former photodiode are disposed in parallel, so that the mean value of dark current generated by the light-shielded photodiode at a point of time close to the time of measurement is initially eliminated, thereby improving the ratio between the dark current component and the signal current component. Then, the signal component is extracted by subtraction of an estimated remaining dark current component which determines the remaining dark current at a point of time further closer to the time of measurement, whereby the signal component is extracted while a favorable S/N ratio is secured.

Also, when irradiation of probe light is controlled so as to generate the respective states where the light is incident and not incident on the photodiode, according to a similar principle, the signal component can be extracted while a favorable S/N ratio is secured.

Accordingly, in each embodiment, without necessitating cooling, even in the case where a photodiode in which a dark current component occupies the major part of the output current signal therefrom is used, the intensity of the light can be determined while a favorable S/N ratio is secured.

In the solid-state imaging device in accordance with the present invention, since the photodetector of the present invention is employed so as to correspond to each pixel, even in the case where a photodiode in which a dark current component occupies the major part of the output current signal therefrom is used, an input image can appropriately be captured in a one-dimensional or two-dimensional form while a favorable S/N ratio is secured.

In the foregoing, each embodiment of the photodetector used photodiodes is described. But the photodetector of the present invention is employed by using the position sensitive device or the photoconductor instead of the photodiode.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Applications No. 8-217601 (217601/1996) filed on Aug. 19, 1996, No. 8-217602 (217602/1996) filed on Aug. 19, 1996, and No. 8-217603 (217603/1996) filed on Aug. 19, 1996 are hereby incorporated by reference.

What is claimed is:

1. A photodetector comprising:
a light chopper for periodically transmitting and blocking light to be measured;
a photoelectric conversion element which generates an electric charge in response to an intensity of light to be measured incident thereon and outputs thus generated electric charge as a current signal;
a dark current cancelling circuit which determines, based on the signal outputted from said conversion element when said light is blocked and a dark current cancel instruction signal is insignificant, an approximate mean value of dark current and cancels thus determined mean value from the signal outputted from the conversion element when the dark current cancel instruction signal is significant;
an integrating circuit which, according to an integration instruction signal, integrates the remaining current from said dark current cancelling circuit and causes thus integrated signal to be held at a first capacitor connected between input and output terminals thereof;
a differential arithmetic circuit which, in response to a subtraction instruction signal and based on a signal outputted from said integrating circuit, holds a first value integrated for a predetermined time when said light is blocked and outputs a signal corresponding to a difference between said first value and a second value integrated for said predetermined time when said light is transmitted; and
a timing generating circuit which, based on a light transmitting state indication signal outputted from said light chopper and in synchronization with a change in said light transmitting state indication signal, outputs said integration instruction signal, said dark current cancel instruction signal, and said subtraction instruction signal.

2. A photodetector according to claim 1, wherein said photoelectric conversion element is a photodiode having a cathode terminal set to a reference potential; and
wherein said integrating circuit comprises an operational amplifier having a negative input terminal for receiving the signal outputted from said conversion element and a positive input terminal set to said reference potential.

3. A photodetector according to claim 1, wherein said dark current cancelling circuit comprises:
a field-effect transistor having a source terminal connected to an input terminal of said integrating circuit and a drain terminal set to a reference potential;
a second capacitor having a first terminal connected to a gate terminal of said field-effect transistor and a second terminal set to said reference potential; and
a first switch element having a first terminal connected to the gate terminal of said field-effect transistor and a second terminal connected to the output terminal of said integrating circuit, said first switch element opening and closing in response to said dark current cancel instruction signal.

4. A photodetector according to claim 1, wherein said light to be measured is an infrared ray, and wherein said photoelectric conversion element is a photodiode comprising InGaAs.

5. A solid-state imaging apparatus wherein the photodetectors according to claim 1 are arranged in a one-dimensional or two-dimensional form.

6. A photodetector comprising:
a first photoelectric conversion element which generates an electric charge in response to an intensity of light to be measured incident thereon and outputs thus generated electric charge as a current signal;
a second photoelectric conversion element having a light-shield and a dark current characteristic substantially identical to that of said first conversion element;
a dark current cancelling circuit which determines, based on the signal outputted from said second conversion element when a dark current cancel instruction signal is insignificant, an approximate mean value of dark current and cancels thus determined mean value from the signal outputted either from the first or second conversion element according to a light detection instruction signal when said dark current cancel instruction signal is significant;

an integrating circuit which, according to an integration instruction signal, integrates the remaining current from said dark current cancelling circuit respectively when a light detection instruction signal is significant and insignificant, and causes thus integrated signal to be held at a first capacitor connected between input and output terminals thereof;

a differential arithmetic circuit which receives a signal outputted from said integrating circuit, in response to a subtraction instruction signal, holds a first value corresponding to said second conversion element for a predetermined time, and outputs a signal corresponding to a difference between said first value and a second value corresponding to said first conversion element for said predetermined time; and a timing generating circuit for outputting said light detection instruction signal, said integration instruction signal, said dark current cancel instruction signal, and said subtraction instruction signal.

7. A photodetector according to claim 6, wherein each of said first and second conversion element is a photodiode having a cathode terminal set to a reference potential; and wherein said integrating circuit comprises an operational amplifier having a negative input terminal for receiving the signals outputted from said first and second conversion elements and a positive input terminal set to said reference potential.

8. A photodetector according to claim 6, wherein said dark current cancelling circuit comprises:

a field-effect transistor having a source terminal connected to an input terminal of said integrating circuit and a drain terminal set to a reference potential;

a second capacitor having a first terminal connected to a gate terminal of said field-effect transistor and a second terminal set to said reference potential; and a first switch element having a first terminal connected to the gate terminal of said field-effect transistor and a second terminal connected to the output terminal of said integrating circuit, said first switch element opening and closing in response to said dark current cancel instruction signal.

9. A photodetector according to claim 6, further comprising a current signal selecting circuit, said current signal selecting circuit comprising:

a second switch element having a first terminal connected to an output terminal of said first conversion element and a second terminal connected to an input terminal of said integrating circuit, said second switch element closing when said light detection instruction signal is significant;

a third switch element having a first terminal connected to the output terminal of said first conversion element and a second terminal set to a reference potential, said third switch element closing when said light detection instruction signal is insignificant;

a fourth switch element having a first terminal connected to an output terminal of said second conversion element and a second terminal connected to an input terminal of said integrating circuit, said fourth switch element closing when said light detection instruction signal is insignificant; and a fifth switch element having a first terminal connected to the output terminal of said second conversion element and a second terminal set to said reference potential, said fifth switch element closing when said light detection instruction signal is significant.

10. A photodetector according to claim 6, wherein said light to be measured is an infrared ray, and wherein each of said first and second photoelectric conversion elements is a photodiode comprising InGaAs.

11. A solid-state imaging apparatus wherein the photodetectors according to claim 6 are arranged in a one-dimensional or two-dimensional form.

12. A photodetector comprising:

a light source for outputting, in response to a light irradiation instruction signal, probe light to irradiate an object to be measured;

a photoelectric conversion element which generates an electric charge in response to an intensity of light to be measured generated upon irradiation with said probe light and outputs thus generated electric charge as a current signal;

a dark current cancelling circuit which determines, based on a signal outputted from said conversion element when said probe light is not irradiated, an approximate mean value of dark current and, in response to a dark current cancel instruction signal, cancels said mean value from the signal outputted from said conversion element;

an integrating circuit which, according to an integration instruction signal, integrates the remaining current from said dark current cancelling circuit and causes thus integrated signal to be held at a first capacitor connected between input and output terminals thereof;

a differential arithmetic circuit which, in response to a subtraction instruction signal and based on a signal outputted from said integrating circuit, holds a first value for a predetermined time when said probe light is not irradiated and outputs a signal corresponding to a difference between said first value and a second value for said predetermined time when said probe light is irradiated; and a timing generating circuit for outputting said light irradiation instruction signal, said integration instruction signal, said dark current cancel instruction signal, and said subtraction instruction signal.

13. A photodetector according to claim 12, wherein said photoelectric conversion element is a photodiode having a cathode terminal set to a reference potential; and wherein said integrating circuit comprises an operational amplifier having a negative input terminal for receiving the signal from said conversion element and a positive input terminal set to said reference potential.

14. A photodetector according to claim 12, wherein said dark current cancelling circuit comprises:

a field-effect transistor having a source terminal connected to an input terminal of said integrating circuit and a drain terminal set to a reference potential;

a second capacitor having a first terminal connected to a gate terminal of said field-effect transistor and a second terminal set to said reference potential; and a first switch element having a first terminal connected to the gate terminal of said field-effect transistor and a second terminal connected to the output terminal of said integrating circuit, said first switch element opening and closing in response to said dark current cancel instruction signal.

15. A photodetector according to claim 12, wherein said light to be measured is an infrared ray, and wherein said photoelectric conversion element is a photodiode comprising InGaAs.

16. A solid-state imaging apparatus wherein the photodetectors according to claim 12 are arranged in a one-dimensional or two-dimensional form.

* * * * *